United States Patent
Washio

(10) Patent No.: US 9,345,312 B1
(45) Date of Patent: May 24, 2016

(54) MOBILE DEVICE TRANSPORTATION APPARATUS

(71) Applicant: Gregory Washio, Boca Raton, FL (US)

(72) Inventor: Gregory Washio, Boca Raton, FL (US)

(\*) Notice: Subject to any disclaimer, the term of this patent is extended or adjusted under 35 U.S.C. 154(b) by 0 days.

(21) Appl. No.: 14/615,797

(22) Filed: Feb. 6, 2015

(51) Int. Cl.
A45C 13/00 (2006.01)
A45F 5/02 (2006.01)
F16B 1/00 (2006.01)
H05K 5/00 (2006.01)
H05K 5/02 (2006.01)

(52) U.S. Cl.
CPC ... *A45F 5/02* (2013.01); *F16B 1/00* (2013.01); *H05K 5/0086* (2013.01); *H05K 5/0204* (2013.01); *A45F 2005/025* (2013.01); *F16B 2001/0035* (2013.01)

(58) Field of Classification Search
CPC ..... A45F 5/02; A45F 5/021; A45F 2005/026; A45F 2200/0516; A45F 5/00; A45F 2005/025; A45F 2005/204; H04B 1/3888; B60R 11/00; B60R 2011/0057; B60R 2011/0059; B60R 2011/007; B60R 2011/0071; H05K 5/0204; F16B 2001/0035; F16B 1/00
USPC .......................................... 24/3.11, 3.12, 303
See application file for complete search history.

(56) References Cited

U.S. PATENT DOCUMENTS

| 3,097,406 | A | * | 7/1963 | Yarborough | A45C 13/185 24/11 P |
| 2003/0000976 | A1 | * | 1/2003 | Malhotra | A45F 5/00 224/197 |
| 2004/0045133 | A1 | * | 3/2004 | Buettell | A45F 5/02 24/3.12 |
| 2004/0232180 | A1 | * | 11/2004 | Badillo | A45F 5/02 224/269 |
| 2008/0227419 | A1 | * | 9/2008 | Traub | H04B 1/3888 455/186.1 |
| 2010/0327031 | A1 | * | 12/2010 | Olmos | A45F 5/02 224/269 |
| 2013/0061990 | A1 | * | 3/2013 | Syma | A45C 1/06 150/137 |

\* cited by examiner

*Primary Examiner* — Robert J Sandy
*Assistant Examiner* — David Upchurch
(74) *Attorney, Agent, or Firm* — Dunlap Bennett & Ludwig PLLC

(57) ABSTRACT

A connector apparatus having a base and a clip is used to attach a mobile device to an article of clothing. The base may include a front surface, a rear surface, and an outer edge. The rear surface is attachable to an object, such as a mobile device. The clip is pivotally attached to the outer edge of the base and includes an inner edge forming an inner opening in between. The clip includes a gate having an open position where the inner opening in exposed, and a closed position where the inner opening is enclosed.

8 Claims, 4 Drawing Sheets

MOBILE DEVICE TRANSPORTATION APPARATUS

BACKGROUND OF THE INVENTION

The present invention relates to the transportation of mobile devices and, more particularly, to a mobile device clip attachable to an article of clothing.

A mobile phone is a phone that can make and receive telephone calls over a radio link while moving around a wide geographic area. Mobile phones are extremely popular and are typically kept in a pants pocket or purse while being transported. Mobile phones, tablets and other electronic device can be quite large and may feel bulky and uncomfortable in a pocket. Alternatively, current phone carrying devices may require two pieces or have hooks, clips and clamps that dangle or protrude when not in use. A user may find these devices to be bulky, lack options and generally inconvenient.

As can be seen, there is a need for an improved clip for securing phones and mobile devices to articles of clothing, handbags, neck chains and lanyards.

SUMMARY OF THE INVENTION

In one aspect of the present invention, a connector apparatus comprises: a base comprising a front surface, a rear surface and an outer edge, wherein the rear surface is securable to an object; and a clip pivotally attached to the outer edge of the base and comprising an inner edge forming an inner opening in between, wherein the clip comprises a gate comprising an open position wherein the inner opening is exposed, and a closed position, wherein the inner opening is enclosed, wherein the connector apparatus comprises an expanded position and a contracted position, wherein the contracted position comprises the clip pivoted towards the base so that the base is substantially within the inner opening, and the expanded position comprises the clip pivoted away from the base so that the base is substantially outside of the inner opening.

In another aspect of the present invention, a method of securing a phone to an article of clothing comprises: providing a connector apparatus comprising: a base comprising a front surface, a rear surface and an outer edge; and a clip pivotally attached to the outer edge of the base and comprising an inner edge forming an inner opening in between sized to receive the base within; adhering the rear surface of the base to a phone or phone case; pivoting the clip away from the base; and attaching the clip to the article of clothing.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

The present invention includes a clip apparatus that adheres to a mobile phone or case and attaches the phone to objects such as, but not limited to, a belt loop, a handbag strap, a lanyard, a chain, and the like. To attach the present invention to an article of clothing, the user may flip up the ring, push the gate and hook the clip onto the article of clothing. The clip of the present invention retracts and lays flat on the surface of the phone, mobile device, or case when not in use. Magnets may hold the clip around the body when not in use.

The present invention may include a self closing ring that drops over a body and has a gate that pivots on an axis to open and a spring to self-close. Magnets on the ring interface with magnets on the body to hold the apparatus closed when not in use. The body and ring is joined by the connector eyelet surrounding an indented portion on the ring. The connection loop allows the ring to move freely up and down but prevents the ring from moving laterally. The body is round and flat and may include magnets in the sides that interface with magnets on self-closing ring. These magnets prevent the ring from lifting until the user pulls on the ring. Fast drying glue on the bottom of body is covered by a paper seal. The apparatus may be permanently adhered when users remove the seal and presses body to the mobile device or case.

Figure 1:
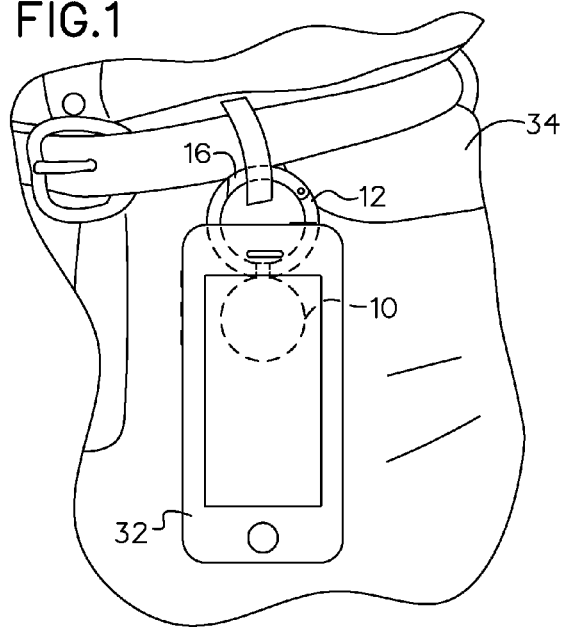
FIG. 1 is a back view of an embodiment of the present invention shown in use.
Figure 2:
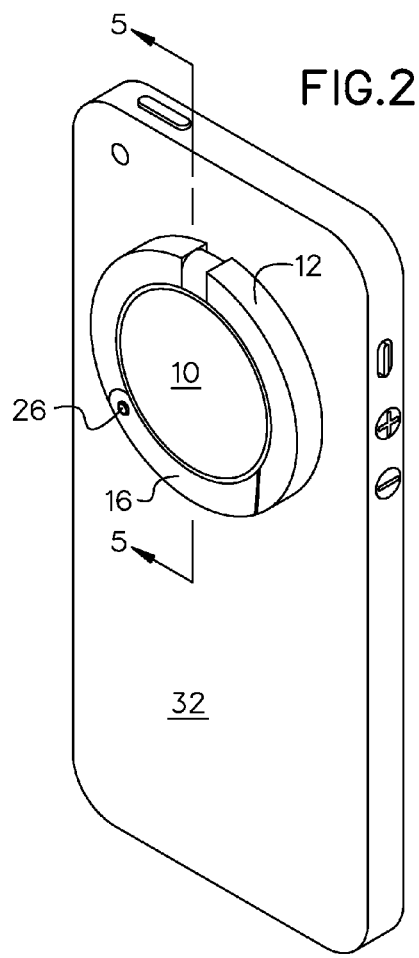
FIG. 2 is a front perspective view of an embodiment of the present invention shown in use.
Figure 3:
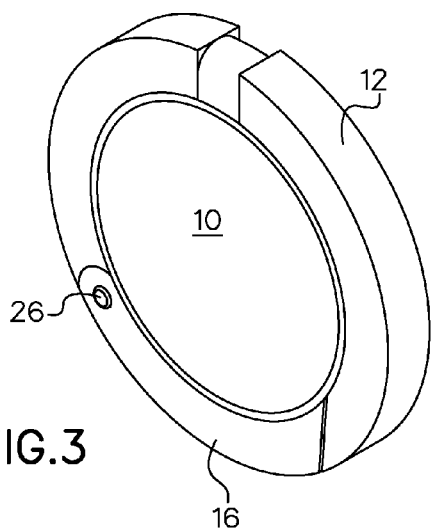
FIG. 3 is a front perspective view of an embodiment of the invention shown in the contracted position.
Figure 4:
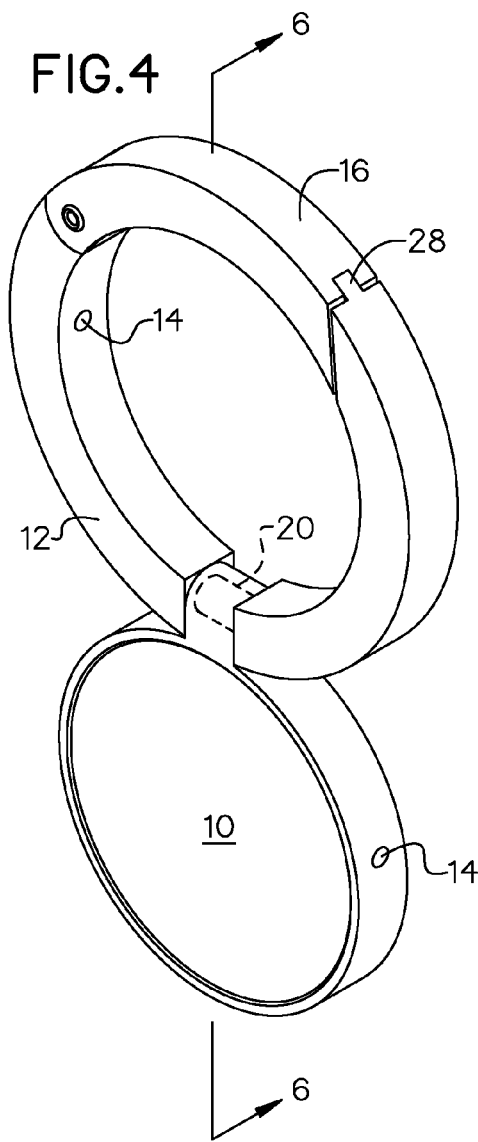
FIG. 4 is a front perspective view of an embodiment of the invention shown in the expanded position.
Figure 5:
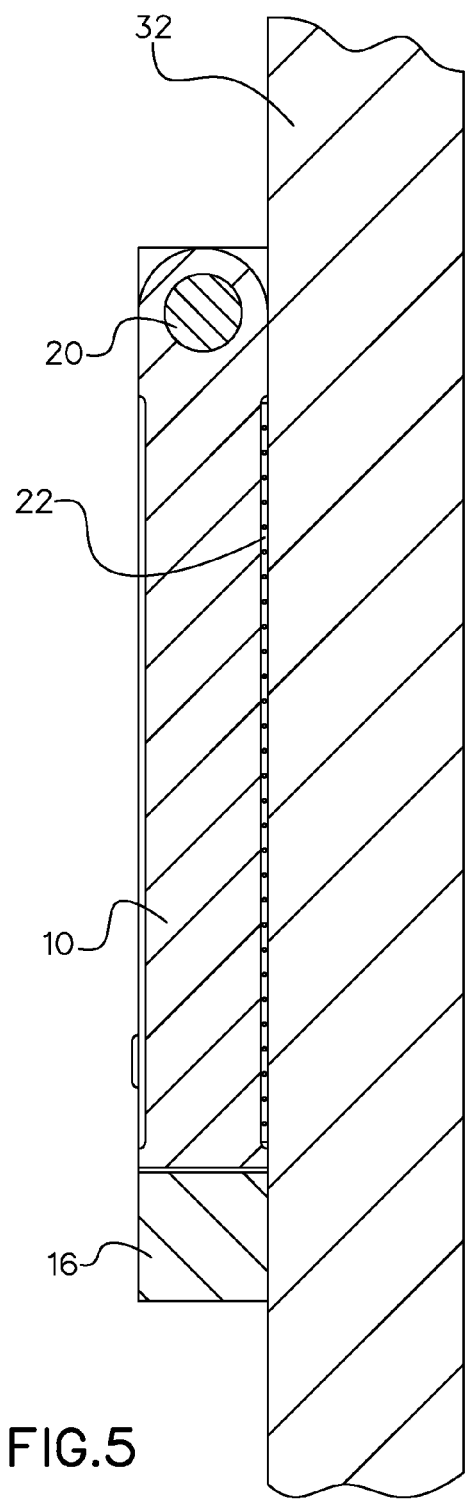
FIG. 5 is a section view taken from 5-5 in FIG. 2.
Figure 6:
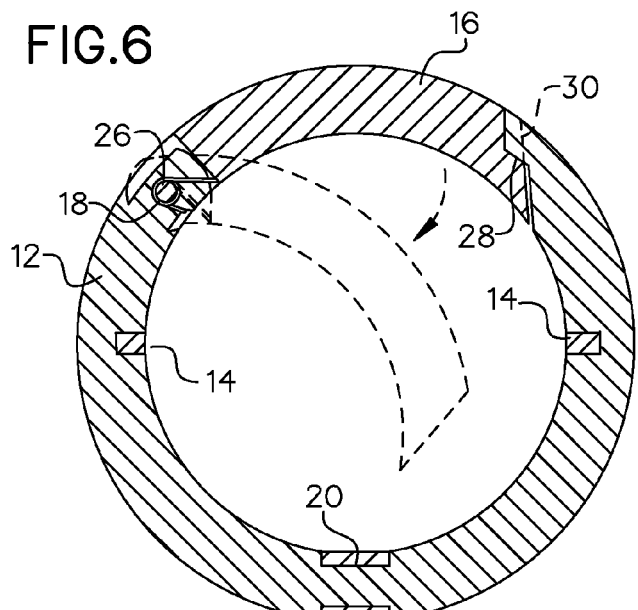
FIG. 6 is a section view taken from 6-6 in FIG. 4.
Figure 7:
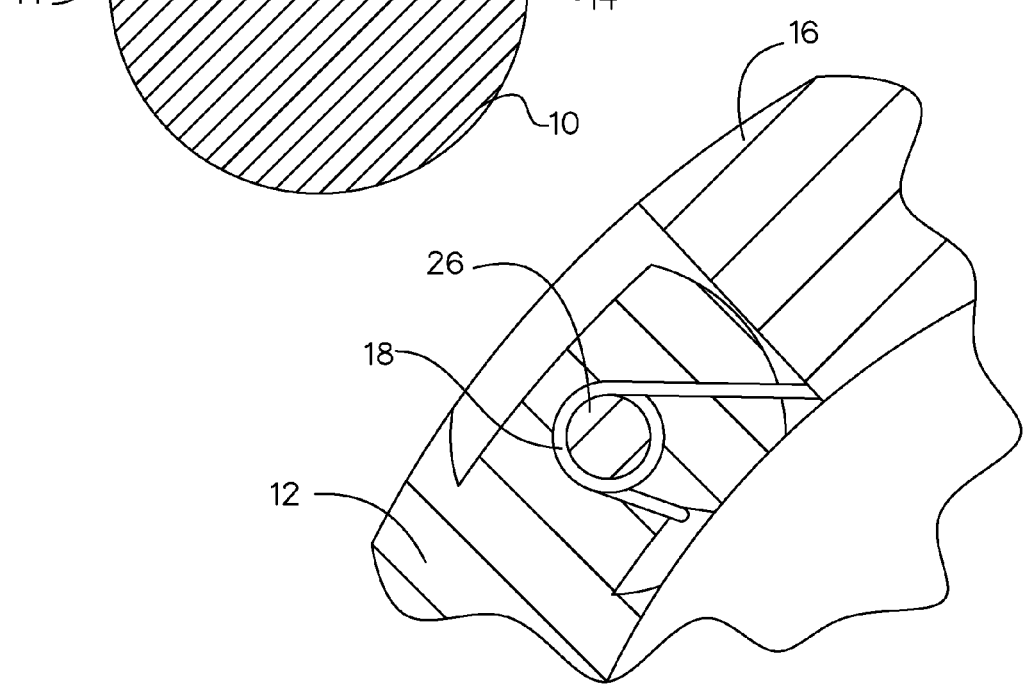
FIG. 7 is an enlarged section view of the spring illustrated in FIG. 6.
Figure 8:
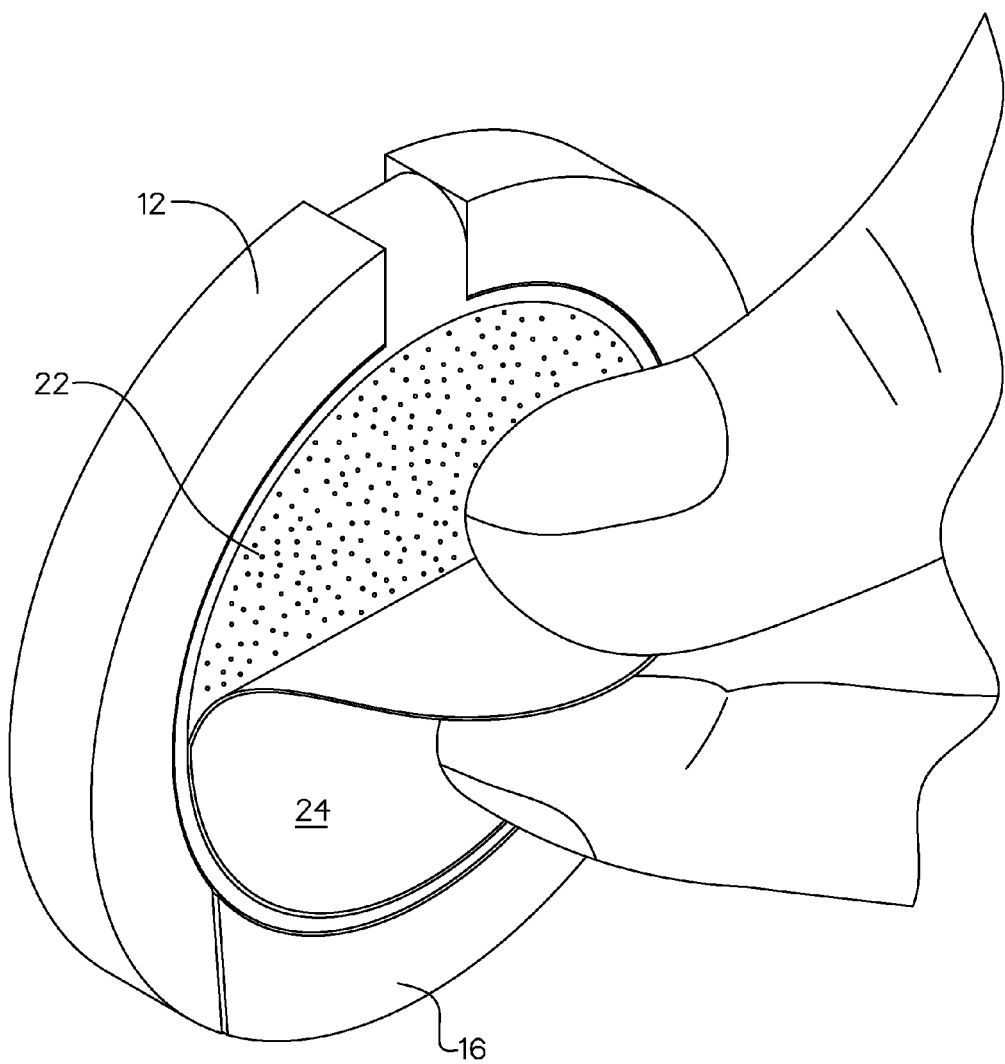
FIG. 8 is a back perspective view of an embodiment of the present invention illustrating the removal of the paper seal.

Referring to FIGS. 1 through 7, the present invention may include a connector apparatus having a base 10 and a clip 12. The base 10 may include a front surface, a rear surface, and an outer edge. The rear surface is attachable to an object, such as a mobile device 32. The clip 12 is pivotally attached to the outer edge of the base 10 and includes an inner edge forming an inner opening in between. The clip 12 includes a gate 16 having an open position where the inner opening in exposed, and a closed position where the inner opening is enclosed.

The connector apparatus of the present invention includes an expanded position and a contracted position. The contracted position includes the clip 12 pivoted towards the base 10 so that the base 10 is substantially within the inner opening. The expanded position includes the clip 12 pivoted away from the base 10 so that the base 10 is substantially outside of the inner opening. The clip 12 may be pivoted to the expanded position to connect the clip 12 to an article of clothing, such as a belt loop. The clip 12 may be pivoted to the contracted position when the clip 12 is detached from the article of clothing, and the mobile device 32 is being used.

The clip 12 may be connected to an eyelet 20 protruding from the outer edge of the base 10. In such embodiments, the clip 12 may include an indent with a tubular shape. The eyelet may 20 include a circular opening. The indented portion of the clip 12 may rotate freely within the eyelet 20, thereby pivotally connecting the clip 12 to the base 10.

In certain embodiments, the clip 12 may be a ring forming a circular inner opening. The outer edge of the base 10 is circular and formed to fit within the circular inner opening. The ring shaped clip 12 is a continuous ring. However, when the gate 16 is opened, the continuous ring is broken and the circular inner opening is exposed so that the ring shaped clip 12 may clip onto a belt loop. The gate 16 is then closed, forming the continuous ring, and thereby securing the belt loop within.

The gate 16 may be connected to the clip 12 by a pivot pin 26. A spring 18 may wrap around the pivot pin 26, thereby biasing the gate 16 in the closed position and forming the continuous ring. The open position includes the gate 16 pivoted into the inner opening. The closed position includes the gate 16 pivoted away from the inner opening. The clip 12 may include a protruding stopper 28. The gate 16 may include a stopper slot 30. The stopper 28 may fit within the stopper slot 30 in the closed position, preventing the gate 16 from pivoting outside the boundary of the clip 12.

In certain embodiments, the clip 12 may be retained in the retracted position by magnets 14. In such embodiments, the magnets 14 may be embedded in the clip 12 and the base 10. The magnets 14 may be made of a ferromagnetic material or include magnets 14 of an opposite polarity. Therefore, when the base 10 is within the clip 12, the clip 12 may not freely pivot away from the base 10 without an applied force. Therefore, when a user 34 is using the mobile device 32, the clip 12 is not in the way. In alternate embodiments, the clip 12 may be retained over the base 10 by mechanical devices, such as springs.

The base 10 of the present invention may be adhered to a mobile device 32 by an adhesive 22. In such embodiments, a layer of adhesive 22 is on the rear surface of the base 10. A paper seal 24 may be attached to the adhesive prior to use. The paper seal 24 may be removed, and the rear surface of the base 10 may be pressed against the mobile device 32, securing the connector apparatus to the mobile device 32. The connector apparatus may be attached to the mobile device 32 by other means, such as clips, and fasteners.

A method of securing the mobile device 32 to an article of clothing may include the following. The connector apparatus disclosed above is provided. The rear surface of the base 10 is adhered to the mobile device 32 or mobile device case. The clip 12 is pivoted away from the base 10. The clip 12 is then attached to the article of clothing. The method may further include removing the clip 12 from the article of clothing and pivoting the clip 12 towards the base 10 so that the base 10 is within the inner opening. Further, when the gate 16 is secured to the clip 12 by a pivot pin 26 and spring 18, the gate 16 is pivoted towards the inner opening of the clip 12, the clip 12 is secured over the article of clothing so that the article of clothing is within the inner opening, and the gate 16 is released into the closed position.

It should be understood, of course, that the foregoing relates to exemplary embodiments of the invention and that modifications may be made without departing from the spirit and scope of the invention as set forth in the following claims.

What is claimed is:

1. A connector apparatus comprising:
a base comprising a front surface, a rear surface and an outer edge, wherein the rear surface is securable to an object; and
a clip pivotally attached to the outer edge of the base by an eyelet and a tubular member disposed within the eyelet, wherein the clip comprises an inner edge forming an inner opening in between and a gate comprising an open position wherein the inner opening is exposed, and a closed position, wherein the inner opening is enclosed, wherein the connector apparatus comprises an expanded position and a contracted position, wherein the contracted position comprises the clip pivoted towards the base so that the base is substantially within the inner opening, and the expanded position comprises the clip pivoted away from the base so that the base is substantially outside of the inner opening.

2. The connector apparatus of claim 1, wherein the rear surface comprises an adhesive.

3. The connector apparatus of claim 1, wherein the gate is connected to the clip by a pivot pin comprising a spring biasing the gate in the closed position.

4. The connector apparatus of claim 3, wherein the open position comprises the gate pivoted into the inner opening and the closed position comprises the gate pivoted away from the inner opening and resting against a stopper formed on the clip.

5. The connector apparatus of claim 1, wherein the clip is a ring forming a circular inner opening, and wherein the outer edge of the base is circular and formed to fit within the circular inner opening.

6. The connector apparatus of claim 1, wherein the clip comprises magnets and the base is formed of a ferromagnetic material.

7. A connector apparatus comprising:
a base comprising a front surface, a rear surface and a circular outer edge, wherein the rear surface is securable to an object; and
a clip comprising a ring forming an circular inner opening sized to receive the circular outer edge of the base within, wherein the clip is pivotally attached to the outer edge of the base, wherein the clip comprises a gate comprising an open position wherein the inner opening is exposed, and a closed position, wherein the inner opening is enclosed,
wherein the connector apparatus comprises an expanded position and a contracted position, wherein the contracted position comprises the clip pivoted towards the base so that the base is substantially within the circular inner opening, and the expanded position comprises the clip pivoted away from the base so that the base is substantially outside of the circular inner opening.

8. A connector apparatus comprising:
a base comprising a front surface, a rear surface, an outer edge and a magnet, wherein the rear surface is securable to an object; and
a clip comprising a magnet attracted to the magnet of the base, wherein the clip is pivotally attached to the outer edge of the base and comprises an inner edge forming an inner opening in between, wherein the clip comprises a gate comprising an open position wherein the inner opening is exposed, and a closed position, wherein the inner opening is enclosed,
wherein the connector apparatus comprises an expanded position and a contracted position, wherein the contracted position comprises the clip pivoted towards the base so that the base is substantially within the inner opening, and the expanded position comprises the clip pivoted away from the base so that the base is substantially outside of the inner opening.

* * * * *